United States Patent [19]
Lev

[11] Patent Number: 5,438,283
[45] Date of Patent: Aug. 1, 1995

[54] FAST STATIC CASCODE LOGIC GATE

[75] Inventor: Lavi A. Lev, San Jose, Calif.

[73] Assignee: Sun Microsystems, Inc., Mountain View, Calif.

[21] Appl. No.: 288,918

[22] Filed: Aug. 11, 1994

[51] Int. Cl.⁶ .......................................... H03K 19/096
[52] U.S. Cl. ..................................... 326/108; 326/34; 326/86
[58] Field of Search ..................... 326/34, 86, 105–108, 326/114, 121

[56] References Cited

U.S. PATENT DOCUMENTS

| | | | |
|---|---|---|---|
| 4,080,539 | 3/1978 | Stewart | 326/68 X |
| 4,360,901 | 11/1982 | Proebsting | 326/106 X |
| 4,404,474 | 9/1983 | Dingwall | 326/106 X |
| 4,491,748 | 1/1985 | Chappell et al. | 326/106 X |
| 4,498,021 | 2/1985 | Uya | 326/86 |
| 4,645,952 | 2/1987 | van Tran | 326/121 |
| 5,264,741 | 11/1993 | Srinivasan et al. | 326/121 X |
| 5,276,366 | 1/1994 | Quigley et al. | 326/121 X |

Primary Examiner—David R. Hudspeth
Attorney, Agent, or Firm—Blakely Sokoloff Taylor & Zafman

[57] ABSTRACT

A fast static logic gate contains a pullup logic network and a pulldown logic network configured to implement a logic function. The pullup logic network is coupled to receive gate inputs, and generates a first voltage level at a first node to represent a first state in accordance with the gate inputs and logic function. The first voltage level is less than the source voltage for the fast static logic gate circuit. A leaker circuit generates a second voltage level at the first node in response to a second state of the logic function. A driver circuit is coupled to a second node for generating an output. The pulldown logic network receives the gate inputs, and generates a second voltage level for the output to represent the second state in accordance to the gate inputs and logic function. The switch circuit couples the first node to the second node when the logic function generates the second state, and couples the source voltage to the second node when the logic function generates the first state. In this way, the driver circuit receives a full source voltage representing the first state.

18 Claims, 4 Drawing Sheets

FAST STATIC CASCODE LOGIC GATE

FIELD OF THE INVENTION

The present invention relates to a logic gate, and more specifically to methods and apparatus for a fast static cascode logic gate.

BACKGROUND OF THE INVENTION

FIG. 1 illustrates a prior art fast static NOR gate 15. The fast static NOR gate 15 contains an OR pullup network 10 and an OR pulldown network 20. The OR pullup network 10 receives, as inputs, "n" gate inputs ($I_1$–$I_n$). The OR pullup network 10 contains a plurality of pullup devices 40, 50 and 60, one for each gate input to the fast static NOR gate 15, respectively. The pullup devices 40, 50 and 60 are n-channel field effect transistors (FETs) used as source followers. The source of each n-channel pullup device is coupled to node A, and the drain of each n-channel pullup device is coupled to a source voltage, $V_{cc}$. The OR pulldown network 20 contains "n" pulldown devices, 70, 80 and 90, one pulldown device for each gate input, respectively. The pulldown devices 70, 80 and 90 are also n-channel FETs. The source of each n-channel pulldown device is coupled to node B, and the drain of each n-channel pulldown device is coupled to ground.

The fast static NOR gate 15 also contains a complimentary metal oxide semiconductor (CMOS) inverter 22 including a p-channel transistor 25 and a n-channel transistor 30. Furthermore, the fast static NOR gate 15 contains a leaker transistor 35, coupled to node A, and implemented with a n-channel transistor. The source of the leaker transistor 35 is coupled to node A, the drain is coupled to ground, and the gate is coupled to $V_{cc}$. The leaker transistor 35 pulls the voltage at node A to a low level logic when the n-channel transistors 40, 50, and 60 are biased to conduct no current.

As shown in FIG. 1, each gate input $I_1$, $I_2$, and $I_n$ to the fast static NOR gate 15 is coupled to the gate of both a pullup device 40, 50, and 60 and a pulldown device 70, 80, and 90. In operation, a high logic level on any gate input results in the corresponding n-channel pullup device driving node A to a "weak" high logic voltage. Because the OR pullup network 10 is implemented with n-channel devices, the "weak" high logic voltage generated at node A is due, in part, to the source voltage, $V_{cc}$, minus the threshold voltage of the corresponding n-channel pullup device. In other logic networks, the "weak" high logic voltage may be further diminished by a series of n-channel transistor threshold voltages, resulting in an even lower high logic voltage. In addition, the "weak" high logic voltage generated at node A is caused by the conduction of current through the leaker transistor 35.

For the prior art static NOR gate 15, the CMOS inverter 22 is constructed to switch upon sensing the "weak" high voltage. When the "weak" high logic level at node A is input to the CMOS inverter 22, the CMOS inverter 22 generates a low logic level at node B. The low logic level at node B represents the gate output of the NOR logic function.

However, because node A does not attain a full high logic voltage, the p-channel transistor 25 is not completely turned off. Consequently, because the p-channel transistor 25 is still conducting current, the n-channel transistor 30 continues to sink current resulting in dissipation of power. Because the transistors 25 and 30 of CMOS inverter 22 drive CMOS compatible outputs, the power dissipation is significant. In addition, the n-channel transistor 30 is properly sized in order to sense the "weak" high at node A so as to sink enough current to pull node B to a low logic level.

If all the gate inputs $I_1$, $I_2$, and $I_n$ to the fast static NOR gate 15 are a low logic level, then the leaker transistor 35 pulls node A to a low logic level. Consequently, the CMOS inverter 22 generates a high logic level at node B. The size of the n-channel leaker transistor 35 is large enough to pull node A low when all n-channel pullup devices are turned off, but is small enough to permit a high logic level at node A when one of the n-channel pullup transistors is turned on. The n-channel transistor 30 is appropriately sized in order to turn off at the low logic level generated at node A from the conduction of current through the leaker transistor 35.

For applications requiring a low source voltage, the fast static NOR gate 15 does not scale accordingly because the n-channel pullup transistors 40, 50, 60 exhibit approximately a 0.5 to 0.6 threshold voltage. Because of this minimum threshold voltage, the sizing of the p-channel transistor 25 and n-channel transistor 30 is crucial. In addition, operating at a low source voltage increases the power dissipation through the CMOS inverter 22. Consequently, it is desirable to construct a fast static gate that minimizes power dissipation.

SUMMARY OF THE INVENTION

The present invention relates to a fast static cascode logic gate. The fast static cascode logic gate includes a cascode or switch circuit to improve the performance of the fast static logic gate. The fast static cascode logic gate contains a pullup logic network and a pulldown logic network. The pullup logic network and the pulldown logic network implement a specific logic function, such as NOR, OR, AND, NAND, etc. gates The pullup logic network is coupled to receive gate inputs, and generates a first voltage level at a first node to represent a first state in accordance with the logic function. The first voltage level is less than the source voltage for the fast static cascode logic gate. The fast static cascode logic gate further contains a leaker circuit, a driver circuit. The leaker circuit generates a second voltage level at the first node in response to a second state of the logic function.

The driver circuit, a complementary metal oxide semiconductor (CMOS) inverter, is coupled to a second node for generating an output. The pulldown logic network receives the gate inputs, and generates a second voltage level for the output to represent the second state in accordance to the gate inputs and logic function. The switch circuit couples the first node to the second node when the logic function generates the second state, and couples the source voltage to the second node when the logic function generates the first state. In this way, the driver circuit receives a full source voltage representing the first state.

In one embodiment, the switch circuit is implemented with a cascode circuit. The cascode circuit includes a complementary metal oxide semiconductor (CMOS) inverter, a p-channel field effect transistor (FET), and a n-channel FET. The CMOS inverter controls the gates of the p-channel FET and the n-channel FET. The p-channel FET couples the source voltage to the second node, and the n-channel FET couples the source voltage to the second node.

In one embodiment, the leaker circuit is implemented with a n-channel FET to provide a pulldown when the pullup logic network generates a second logic state. In a second embodiment, the leaker circuit contains a CMOS inverter coupled to receive an enable line and coupled to the first node at the output such that when the CMOS inverter is disabled with a low logic level voltage, no power is dissipated.

The fast static cascode logic gate operates as fast as the prior art circuit, and the driver circuit is configured to drive full CMOS levels. The cascode circuit of the present invention results in a significant reduction of power dissipation in the driver circuit. In addition, the fast static cascode logic gate allows for less stringent tolerances for the transistor sizes in the driver circuit while maintaining a high level of performance. Therefore, the transistor device sizes in the driver circuit may be selected to accommodate speed and drive considerations.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 2:
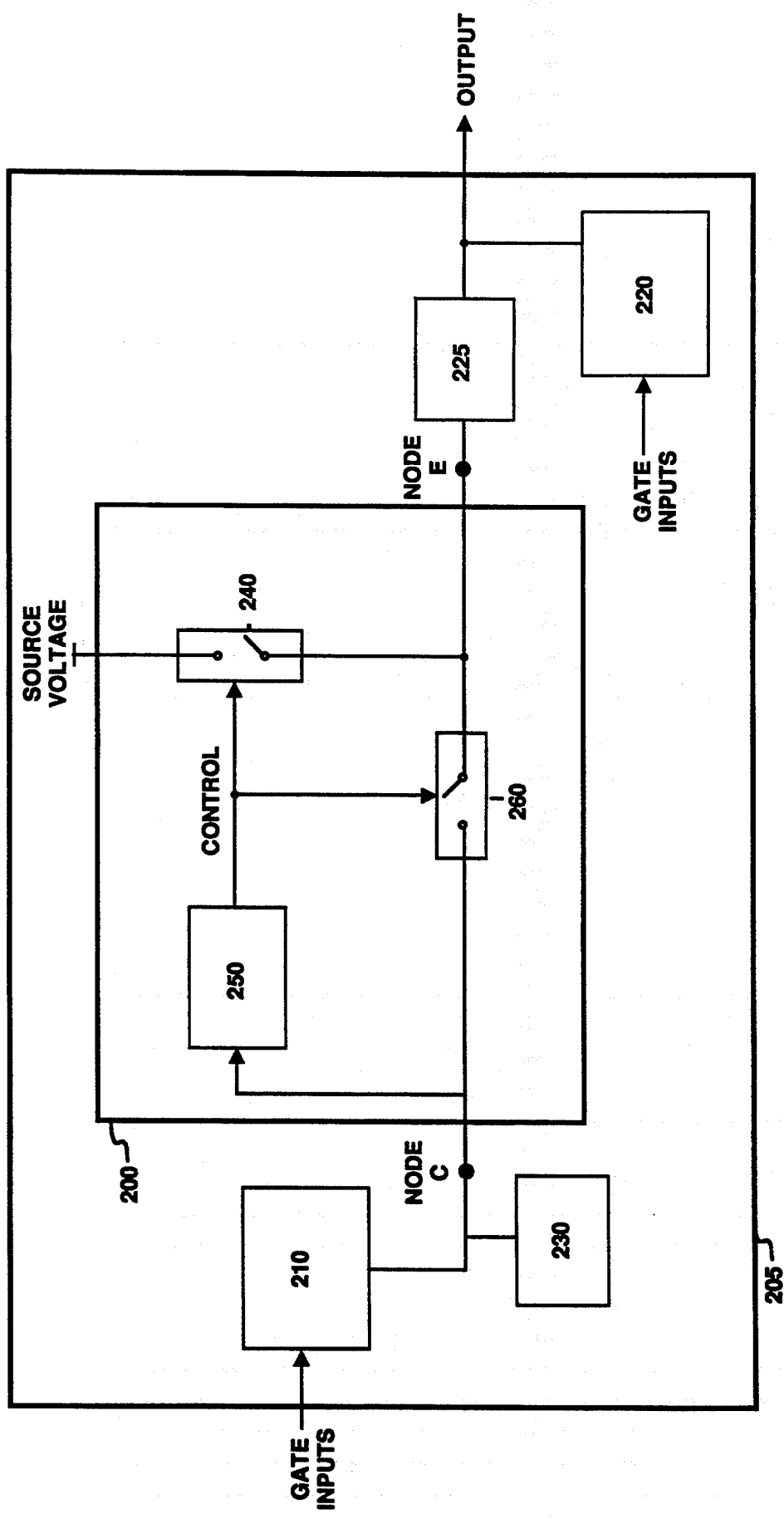
FIG. 2 is a high level block diagram conceptually illustrating the fast static cascode logic gate of the present invention.

FIG. 2 is a high level block diagram conceptually illustrating the fast static cascode logic gate of the present invention. A fast static logic gate 205 contains a pullup logic network 210, a pulldown logic network 220, a leaker circuit 230, an output driver circuit 225, and a switch circuit 200. The switch circuit 200 is coupled between a first node, labeled node C on FIG. 2, and a second node labeled node E on FIG. 2. The switch circuit 200 includes logic control 250, and two switches 240 and 260. The switch 240 is coupled between the source voltage of the fast static logic gate 205 and node E, and the switch 260 is coupled between nodes C and E.

The pullup logic network 210 and the pulldown logic network 220 execute a logic function, such as an OR, NOR, XOR, AND, NAND, or any other logic functions. With an OR logic function, for example, the pullup logic network 210 pulls node C to a source voltage when one of the gate inputs is a high logic level, and the pulldown logic network 220 pulls the output to ground when one of the gate inputs is a high logic level. Alternatively, the pullup logic network 210 does not affect the voltage at node C when all of the gate inputs are at a low logic level, and the pulldown logic network 220 does not affect the output when all of the gate inputs are at a low logic level. The pullup logic network 210 and the pulldown logic network 220 are intended to represent a broad category of logic function implementations which are well known in the art and will not be described further. Accordingly, any logic function may be implemented within the pullup logic networks 210 and pulldown logic network 220 without deviating from the spirit and scope of the invention.

In general, the pullup logic network 210 generates a first state at node C and the pulldown logic network 220 generates a second state at node E in response to the gate inputs and the logic function. As is explained more fully below, the fast static cascode gate of the present invention has application for a large number of gate inputs. For example, the pullup logic network 210 and the pulldown logic network 220 may be configured as a 32 input NOR gate.

In operation, if the pullup logic network 210 conducts current so as to pull the voltage at node C to the "weak" high logic level, then the logic control 250 generates a control signal to close switch 240 and to open switch 260. The closed switch 240 provides the source voltage to node E. Therefore, a full source voltage is input to the output driver circuit 225. Alternatively, if the pullup logic network 210 does not conduct current, then the leaker circuit 230 pulls the voltage at node C to a low logic level. Under these conditions, the logic control 250 generates a control signal to close switch 260 and open switch 240. The closed switch 260 results in charge transfer from node C to node E to provide a voltage representing a low logic level to the input of the output driver 225.

Figure 3:
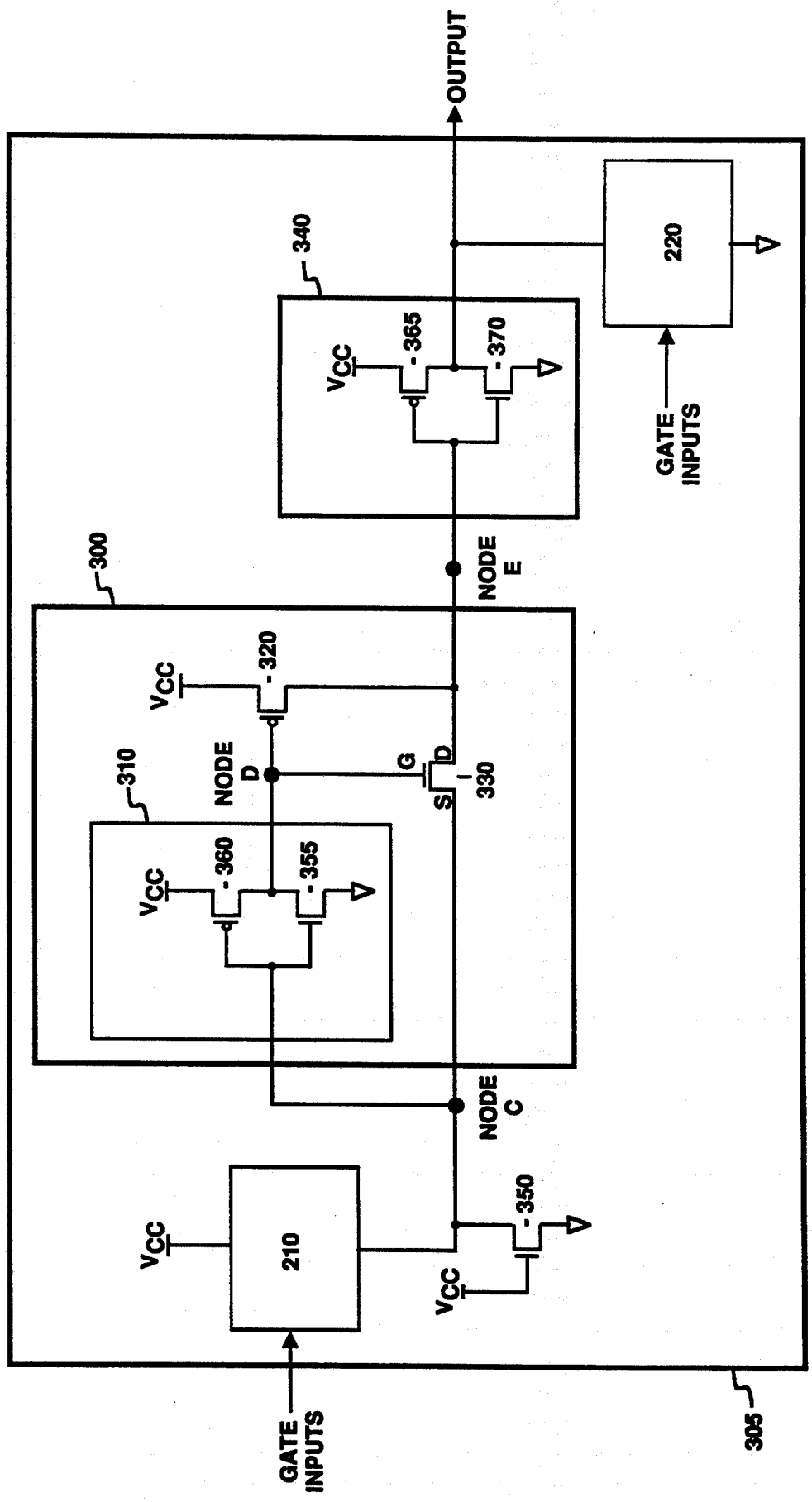
FIG. 3 illustrates one embodiment of a fast cascode logic gate configured in accordance with the present invention.

FIG. 3 illustrates one embodiment of a fast cascode logic gate configured in accordance with the present invention. The fast static logic gate 305 contains the pullup logic network 210 and the pulldown logic network 220. The leaker circuit 230 is implemented with a n-channel transistor 230, and the output driver circuit 225 is implemented with a CMOS inverter containing a p-channel transistor 365 and a n-channel transistor 370. The switch circuit 300 is implemented as a cascode circuit having MOS transistors.

The switch circuit 200 contains a CMOS inverter implemented as the logic control 250. The logic control 250 includes a p-channel transistor 360 and a n-channel transistor 355. The cascode circuit 200 also contains a p-channel transistor 240 coupled between the source voltage, $V_{cc}$, and node E such that the source is coupled to $V_{cc}$ and the drain is coupled to the node E. The switch circuit 200 further includes a n-channel transistor 260 coupled between nodes C and E such that the source is coupled to node C and the drain is coupled to the node E. In one embodiment, the p-channel transistor 240 contains a channel aspect ratio of 5/0.5 (Z/L), and the n-channel transistor 260 contains a channel aspect ratio of 5/0.5 (Z/L). The output of the CMOS logic control 250 is coupled to the gates of p-channel transistor 240 and n-channel transistor 260.

In operation, if the pullup logic network 210 conducts current to generate a "weak" high logic level voltage on node C, then the "weak" high logic level voltage biases the logic control 250 such that the n-channel transistor 355 begins to sink current and the p-channel transistor begins to reduce the sourcing of current to decrease the voltage at node D. As the voltage decreases at node D, the p-channel transistor 240 is biased to start conducting current. Also, as the gate to source voltage at n-channel transistor 260 is decreased, the n-channel transistor 260 decreases the conduction of current between the drain and source. When the gate to source voltage at n-channel transistor 260 drops below the threshold voltage of the device, the n-channel transistor 260 turns off. However, because the "weak" high voltage level is input to the logic control 250, the p-channel transistor 360 continues to conduct some current because the device is not completely turned off.

When the voltage at node D decreases to a level low enough to bias the p-channel transistor 240 in the pinch-off or saturated region, then the voltage at node E equals the source voltage or $V_{cc}$. Consequently, a full source voltage is input to the output driver 225. The full source voltage input to the output driver 225 completely turns off the p-channel transistor 365. The n-channel transistor 370 and the pulldown devices contained within the pulldown logic network 220 drive the output voltage level to a low logic level to provide the appropriate output.

When the gate inputs to the fast static cascode gate 305 result in no conduction of current in the pullup logic network 210, the n-channel leaker transistor 230 conducts current to pull the voltage at node C to a low logic level. The voltage at node C is input to the logic control 250. As the voltage at node C decreases, the p-channel transistor 360 starts to conduct current. As the voltage at node C drops to bias the p-channel transistor 360 in the pinch-off region of operation, node D is driven to the source voltage. In turn, as the voltage at node D increases, the p-channel transistor 240 is biased to reduce the flow of current from the source voltage to node E, and the n-channel transistor 260 is biased to conduct current between nodes C and E. When the voltage at node D reaches a sufficiently low level, the p-channel transistor 240 is biased to conduct no current, and the n-channel transistor 260 is biased to conduct maximum current.

In a preferred embodiment, the fast static cascode logic gate of the present invention comprises more than one gate input. For example, in one embodiment, the fast static cascode logic gate comprises 32 inputs. The operation of the fast static cascode logic gate of the present invention is facilitated by having a plurality of gate inputs. When the fast static logic gate contains more than one gate input, the capacitance at node C is large relative to the capacitance at node E. The large capacitance at node C relative to the capacitance at node E results in rapid charge sharing between nodes C and E. Therefore, when the n-channel transistor 260 is biased to conduct current, charge is rapidly transferred between nodes C and E to drive node E to a low logic level. The charge sharing phenomenon in the fast static cascode logic gate facilities fast switching of the gate. Consequently, the low logic level voltage at node E biases the p-channel transistor 365 to conduct current and to subsequently drive the output to the source voltage $V_{cc}$.

Figure 1:
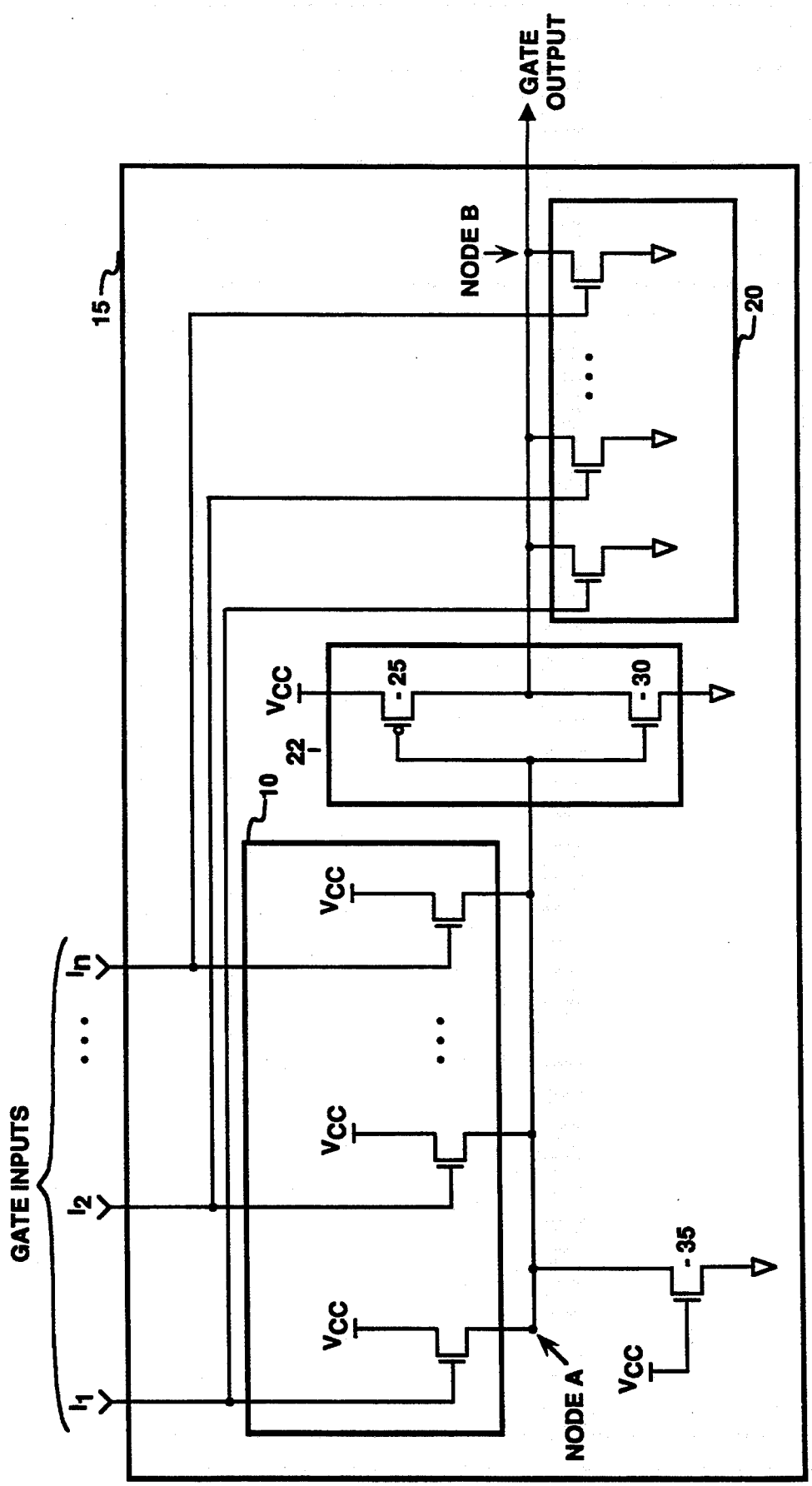
FIG. 1 illustrates a prior art fast static NOR gate.

The fast static cascode logic gate of the present invention operates as fast as the prior art circuit described in FIG. 1. The current consumption in the output driver 225 is significantly reduced because the p-channel transistor 365 is fully turned off when the full high logic level voltage is driven at node E. Consequently, the p-channel transistor 365 may be constructed as a large device. The output driver 225 is configured to drive full CMOS levels. In one embodiment, the p-channel transistor 365 contains a channel aspect ratio of 40/0.5 (Z/L), and the n-channel transistor 370 contains a channel aspect ratio of 2/0.5 (Z/L). The Z dimension specifies the width of the channel in microns, and the L dimension specifies the length of the channel in microns. The channel aspect ratio of the transistors determines the amount of current the transistors conduct when biased an active region.

As discussed above, when the "weak" high logic level voltage appears at node C, the p-channel transistor 360 continues to conduct some current. In one embodiment, the p-channel transistor 360 contains a channel aspect ratio of 3/0.5 (Z/L), and the n-channel transistor 355 contains a channel aspect ratio of 6/0.5 (Z/L). However, because the size of p-channel transistor 360 is much smaller than the size of p-channel transistor 340, much less power is dissipated in the fast static cascode logic gate of the present invention than in the prior art fast static gate.

In order to minimize power dissipation in the prior art gate, the proper sizing of transistors 25 and 30 (FIG. 1) is crucial. However, when fabricating integrated circuit devices, process variations result in a variation in the sizing of the devices. The fast static cascode logic gate of the present invention allows for less strict tolerances for the transistor sizes while maintaining a high level of performance. For example, in the output driver 225, the size margin for the n-channel transistor 370 in the output driver 225 is not critical. All that is required for optimal performance is that p-channel transistor 365 sense the falling voltage at node E to drive the output to a high logic level voltage. Consequently, the n-channel transistor 370 is desensitized by the cascode circuit of the present invention.

In the present invention, the size selection of the p-channel transistor 365 is driven by the switching speed and fan out capabilities desired. Therefore, the device size of p-channel 365 may be selected only to accommodate the speed and drive considerations. In the prior art circuit, gearing the CMOS inverter 22 in one particular direction results in greater power dissipation.

Figure 4:
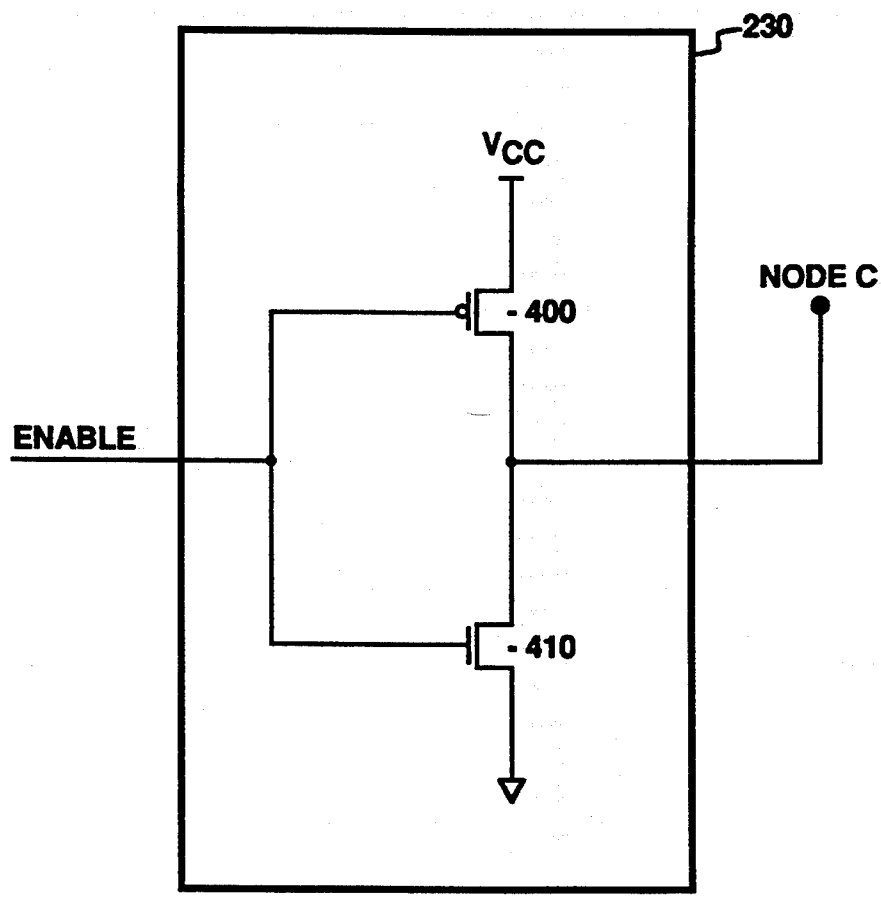
FIG. 4 illustrates a power saving leaker circuit configured in accordance with one embodiment of the present invention.

FIG. 4 illustrates a power saving leaker circuit configured in accordance with one embodiment of the present invention. The leaker circuit 230 (FIG. 2) is implemented with p-channel transistor 400 and a n-channel transistor 410 configured as a CMOS inverter. The leaker circuit 230, when disabled, does not conduct current thereby resulting in a power savings. In a shut down mode, a low logic level voltage is applied to the enable line of the leaker circuit 230. The low logic level voltage biases the n-channel transistor 410 such that no current is conducted from node A to ground, and biases the p-channel transistor 400 to conduct current. Consequently, when the leaker circuit 230 is operating in the shutdown mode, power is not dissipated. When the leaker circuit 230 is operating in an active mode, the enable line is set to a high logic level voltage resulting in the n-channel transistor 410 acting as the leaker transistor.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A circuit comprising:
a pullup logic network coupled to a plurality of inputs and to a first node for implementing a logic function by generating a first voltage level at said first node to represent a first state, said first voltage level being less than a source voltage for said circuit;

a leaker circuit coupled to said first node for generating a second voltage level at said first node in response to a second state of said logic function;

a driver circuit coupled to a second node for generating an output;

a pulldown logic network coupled to receive said inputs for implementing said logic function by generating a second voltage level for said output to represent said second state; and a switch circuit for coupling said first node to said second node when said logic function generates said second state, and for coupling a source voltage to said second node when said logic function generates said first state such that said driver circuit receives said source voltage representing said first state.

2. The circuit as set forth in claim 1, wherein said switch circuit comprises:

logic control coupled to said first node for generating a control signal;

a first switch coupling said source voltage to said second node and being controlled by said control signal; and a second switch coupling said source voltage to said second node and being controlled by said control signal.

3. The circuit as set forth in claim 2, wherein:

said logic control comprises a complementary metal oxide semiconductor (CMOS) inverter;

said first switch comprises a p-channel field effect transistor (FET); and said second switch comprises a n-channel field effect transistor (FET).

4. The circuit as set forth in claim 3, wherein said CMOS inverter is constructed substantially smaller than said driver circuit.

5. The circuit as set forth in claim 1, wherein said driver circuit comprises a complementary metal oxide semiconductor (CMOS) inverter.

6. The circuit as set forth in claim 5, wherein said logic function comprises an OR function such that said output generates a NOR function in response to said gate inputs.

7. The circuit as set forth in claim 1, wherein said gate inputs comprises at least ten gate inputs, said gate inputs being configured to generate a large capacitance so as to rapidly transfer said charge from said first node to said second node when said switch couples said first node to said second node.

8. The circuit as set forth in claim 1, wherein said leaker circuit comprises a n-channel FET.

9. The circuit as set forth in claim 1, wherein said leaker circuit comprise a CMOS inverter coupled to receive an enable line and coupled to said first node at the output such that when said CMOS inverter is disabled with a low logic level voltage, no power is dissipated.

10. A method for generating an output in accordance with a logic function, said method comprising the steps of:

receiving a plurality of inputs for implementing said logic function;

generating, based on said inputs, a first voltage level at a first node in accordance with a first state for said logic function, said first voltage level being less than a source voltage;

generating, based on said inputs, a second voltage level at said first node in accordance with a second state for said logic function;

coupling a driver circuit to a second node, said driver circuit being configured to generate said output to represent said first state;

generating a second voltage level for said output based on said inputs and said logic function;

coupling said first node to said second node when said logic function generates said second state; and coupling a source voltage to said second node when said logic function generates said first state such that said driver circuit receives a full voltage signal representing said first state.

11. The method as set forth in claim 10, wherein the steps of coupling said first node to said second node and coupling a source voltage to said second node comprise the steps of:

providing logic control;

providing a first and second switch;

coupling said logic control to said first node and to said first and second switch;

coupling said source voltage to said second node and being controlled by said logic control; and a second switch coupling said source voltage to said second node and being controlled by said logic control.

12. The method as set forth in claim 11, wherein:

said logic control comprises a complementary metal oxide semiconductor (CMOS) inverter;

said first switch comprises a p-channel field effect transistor (FET); and said second switch comprises a n-channel field effect transistor (FET).

13. The method as set forth in claim 12, wherein said CMOS inverter is substantially smaller than said driver circuit.

14. The method as set forth in claim 10, wherein said driver circuit comprises a complementary metal oxide semiconductor (CMOS) inverter.

15. The method as set forth in claim 14, wherein said logic function comprises an OR function such that said output represents a NOR function in response to said inputs.

16. The method as set forth in claim 10, wherein said inputs comprise at least ten inputs, said inputs being configured to generate a large capacitance so as to rapidly transfer said charge from said first node to said second node when coupling said first node to said second node.

17. The method as set forth in claim 10, wherein the step of generating a second voltage level at said first node comprises the step of providing a n-channel FET coupled between said first node and ground.

18. The method as set forth in claim 10, wherein the step of generating a second voltage level at said first node comprises the step of providing a CMOS inverter coupled to receive an enable line and coupled to said first node at the output such that when said CMOS inverter is disabled with a low logic level voltage no power is dissipated.

* * * * *